(12) United States Patent
Kim

(10) Patent No.: US 8,258,530 B2
(45) Date of Patent: Sep. 4, 2012

(54) LIGHT-EMITTING DEVICES AND METHODS OF FABRICATING THE SAME

(75) Inventor: Yu-Sik Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 185 days.

(21) Appl. No.: 12/662,116

(22) Filed: Mar. 31, 2010

(65) Prior Publication Data

US 2010/0244072 A1    Sep. 30, 2010

(30) Foreign Application Priority Data

Mar. 31, 2009    (KR) .................. 10-2009-0027702

(51) Int. Cl.
*H01L 33/00*    (2010.01)

(52) U.S. Cl. ........... 257/98; 257/E21.001; 257/E33.059; 257/E33.067; 438/26

(58) Field of Classification Search .................... 257/98, 257/E21.001, E33.059, E33.067; 438/26
See application file for complete search history.

(56) References Cited

FOREIGN PATENT DOCUMENTS

| JP | 2007-034699 | 2/2007 |
|----|-------------|--------|
| KR | 10-2008-0030326 | 4/2008 |
| KR | 10-2008-0051581 | 6/2008 |

*Primary Examiner* — Zandra Smith
*Assistant Examiner* — Marvin Payen
(74) *Attorney, Agent, or Firm* — Harness, Dickey & Pierce, P.L.C.

(57) ABSTRACT

A light-emitting device includes: a substrate; a light-emitting element is mounted on a first surface of the substrate; at least one uneven heat dissipation pattern is formed on at least one surface of the substrate; and an electrode covers at least a portion of the at least one uneven heat dissipation pattern and is connected to the light-emitting element.

14 Claims, 13 Drawing Sheets

LIGHT-EMITTING DEVICES AND METHODS OF FABRICATING THE SAME

CROSS REFERENCE TO RELATED APPLICATIONS

This application claims priority under 35 U.S.C. §119 from Korean Patent Application No. 10-2009-0027702 filed on Mar. 31, 2009 in the Korean Intellectual Property Office (KIPO), the disclosure of which is incorporated herein by reference in its entirety.

BACKGROUND

1. Field

Example embodiments of the inventive concepts relate to a light-emitting device, and more particularly, to a light-emitting device with improved heat dissipation properties.

2. Description

Light-emitting devices may be classified into vertical type light-emitting devices, lateral type light-emitting devices, flipchip type light-emitting devices, and the like.

Of the above light-emitting elements, vertical type light-emitting devices are relatively popular due to their reduced size and superior current diffusion properties. For example, a vertical light-emitting device may include a light-emitting structure in which a gallium nitride (GaN) pattern of an n-type, a light-emitting layer pattern, and a GaN pattern of a p-type are stacked. Light is generated when carriers (e.g., electrons) of the n-type GaN pattern combine with carriers (e.g., holes) of the p-type GaN pattern in the light-emitting layer pattern.

If heat generated by a light-emitting device is not effectively dissipated, light-emitting efficiency of the light-emitting device may be reduced.

SUMMARY

According to example embodiments of the inventive concepts, a light-emitting device may include a substrate, at least one uneven heat dissipation pattern on at least one of a first and second surfaces of the substrate, a light-emitting element on the first surface of the substrate, and an electrode covering at least a portion of the at least one uneven heat dissipation pattern and connected to the light-emitting element.

According to example embodiments of the inventive concepts, the at least one uneven heat dissipation pattern may be in a first region of the substrate and a second region of the substrate surrounding the light-emitting element. The first region may include the light-emitting element.

According to example embodiments of the inventive concepts, the at least one heat dissipation pattern may include grooves in the at least one of the first and second surfaces in the first and second region of the substrate.

According to example embodiments of the inventive concepts, the at least one heat dissipation pattern may include grooves in the at least one of the first and second surfaces in the second region of the substrate.

According to example embodiments of the inventive concepts, the grooves of the plurality of heat dissipation patterns may have a pyramid shape.

According to example embodiments of the inventive concepts, the light-emitting device may further include an electrode hole penetrating the substrate. The electrode may include a first electrode on the first surface of the substrate and a second electrode on the second surface of the substrate, and the first electrode and the second electrode may be connected to each other in the electrode hole.

According to example embodiments of the inventive concepts, the substrate may be a silicon substrate doped with impurities of a first conductivity type.

According to example embodiments of the inventive concepts, the light-emitting device may further include at least one zener impurity region containing impurities of a second conductivity opposite to the first conductivity type. The at least one zener impurity region may be in the second surface of the substrate, and the substrate and the zener impurity region may include a zener diode.

According to example embodiments of the inventive concepts, the at least one zener impurity region may be in at least a portion of the plural heat dissipation patterns.

According to example embodiments of the inventive concepts, the light-emitting device may include a mounting groove in the first region of the substrate, the light-emitting element may be in the mounting groove.

According to example embodiments of the inventive concepts, the light-emitting device may further include a phosphor layer on the light-emitting element. The phosphor layer may include a resin and phosphors According to example embodiments of the inventive concepts, the phosphors are dispersed in the resin or are coated on at least a portion of the light-emitting element and the electrode.

According to example embodiments of the inventive concepts, the resin may be at least one of an epoxy resin, a silicon resin, a hard silicon resin, a denatured silicon resin, a urethane resin, an oxetane resin, an acrylic resin, a polycarbonate resin, and polyimide resin.

According to example embodiments of the inventive concepts, the phosphors may be at least one of a nitride-based phosphors, oxynitride-based phosphors, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors, germanate phosphors, rare earth aluminate phosphors, rare earth silicate phosphors, organic phosphors and organic complex phosphors.

According to example embodiments of the inventive concepts, the light-emitting element may include a first conductive pattern of a first conductivity type, a light-emitting pattern and a second conductive pattern of a second conductivity type stacked on a support substrate. The light-emitting element may be connected to the electrode via bumps.

According to example embodiments of the inventive concepts may include a method of fabricating a light-emitting device. The method may include forming insulating films on a first and second surface of a substrate; forming zener impurity regions on the second surface of the substrate; etching the first and second surface of the substrate to form at least one heat dissipation pattern; etching grooves on the heat dissipation patterns to form electrode holes; forming a passivation film on the first and second surfaces of the substrate excluding the zener impurity regions; forming a first and second electrode on the first and second surface of the substrate, respectively; and forming a light-emitting element on the first electrode.

According to example embodiments of the inventive concepts, the method may further include etching a region of the insulating film on the second surface of the substrate and doping the substrate in the etched region to form the zener impurity regions; and connecting the light-emitting element to the first electrode using at least one bump.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
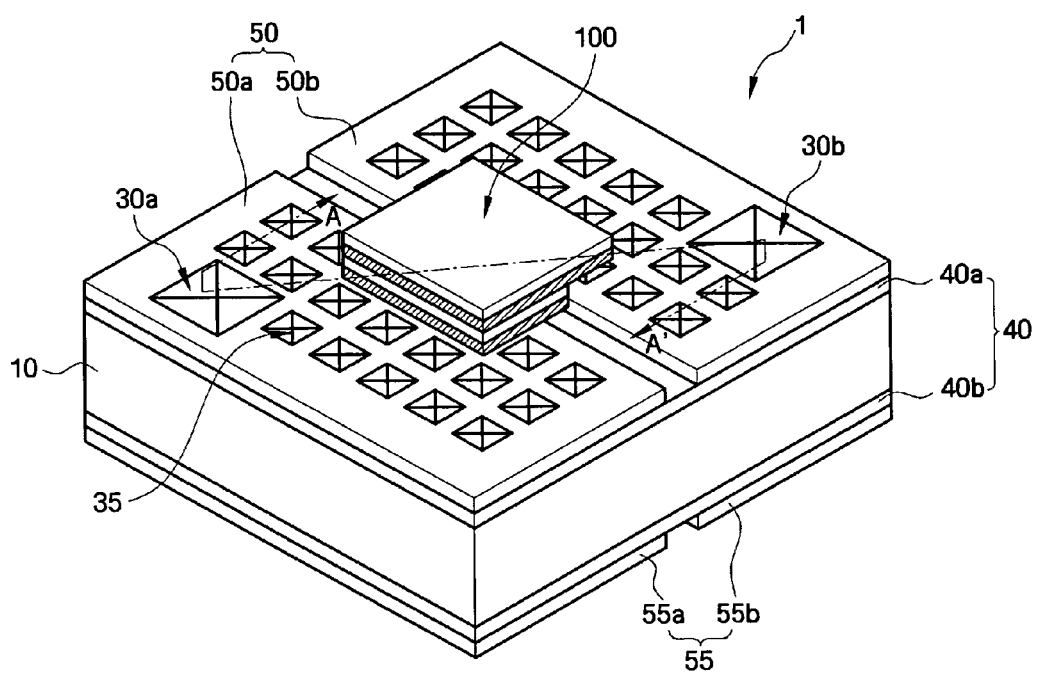
FIG. 1 is a top perspective view of a light-emitting device according to example embodiments of the inventive concepts.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
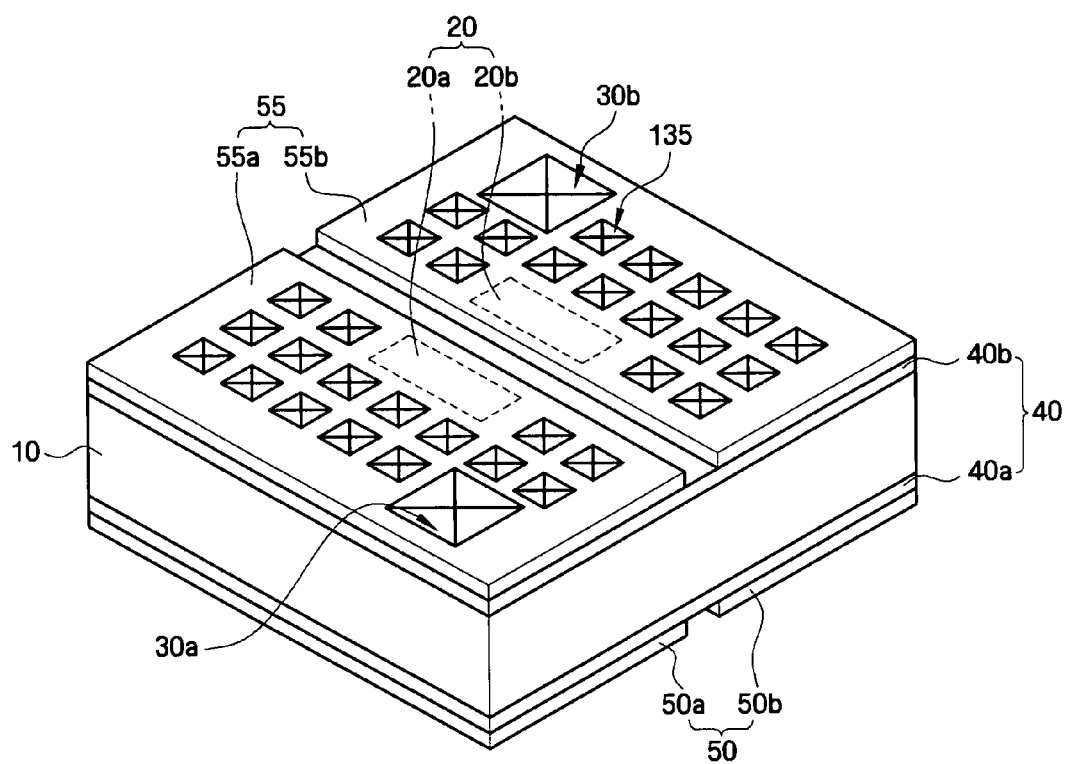
FIG. 2 is a bottom perspective view of the light-emitting device according to example embodiments of the inventive concepts.
Figure 3:
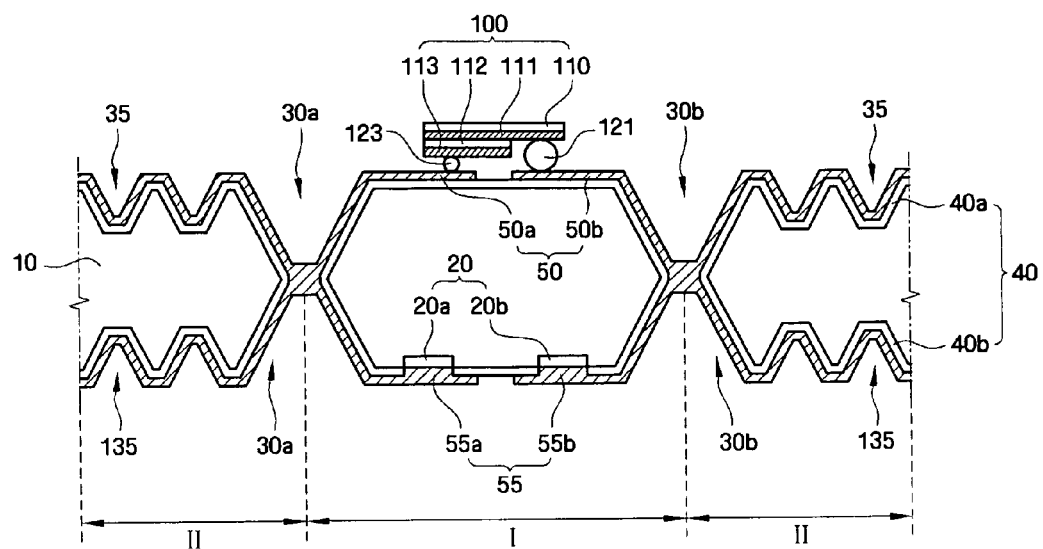
FIG. 3 is a cross-sectional view of the light-emitting device according to example embodiments of the inventive concepts taken along line A-A' in FIG. 1.

Hereinafter, a light-emitting device according to example embodiments of the inventive concepts will be described in detail with reference to FIGS. 1 through 3. FIG. 1 is a top perspective view of a light-emitting device 1 according to example embodiments of the inventive concepts. FIG. 2 is a bottom perspective view of the light-emitting device 1 according to example embodiments of the inventive concepts. FIG. 3 is a cross-sectional view of the light-emitting device 1 according to example embodiments of the inventive concepts taken along line A-A' in FIG. 1.

Referring to FIGS. 1 and 2, in the light-emitting device 1, a light-emitting element 100 is mounted on a first surface of a substrate 10, and one or more uneven heat dissipation patterns (for example, first or second uneven heat dissipation patterns 35 or 135) are formed on at least one surface of the substrate 10. Each of first and second electrodes 50 and 55, which supply power to the light-emitting element 100, covers at least part of the first or second uneven heat dissipation patterns 35 or 135. A zener diode including a zener impurity region 20 is formed on a second surface side (for example, bottom side) of the substrate 10.

The substrate 10 according to example embodiments of the inventive concepts may be a semiconductor substrate made of a material selected from silicon (Si), strained silicon, a silicon alloy, silicon-on-insulator (SOI), silicon carbide (SiC), silicon germanium (SiGe), silicon germanium carbide (SiGeC), germanium (Ge), a germanium (Ge) alloy, gallium arsenide (GaAs), indium arsenide (InAs), aluminum nitride (AlN), and a polyimide-based material. Alternatively, the substrate 10 may be made of a combination or stack of the above materials. However, the material of the substrate 10 is not limited to the above examples.

The substrate 10 according to example embodiments of the inventive concepts may be doped with impurities of a first conductivity type, for example, a P type.

According to example embodiments of the inventive concepts, the light-emitting element 100 may be on a first region I of the substrate 10, and the first and second uneven heat dissipation patterns 35 and 135 may be in a second region II surrounding the first region I.

The zener impurity region 20 is formed on the second surface of the substrate 10 and contains impurities of a second conductivity type which is opposite to the first conductivity type. For example, when the first conductivity type is a P type, the second conductivity type may be an N type. The zener impurity region 20 may include a first zener impurity region 20a and a second zener impurity region 20b which may be separated from each other.

The zener impurity region 20 containing impurities of the second conductivity type is embedded in the first region I of the substrate 10 to form a zener diode, together with the substrate 10 which contains impurities of the first conductivity type.

When an overvoltage is applied to the light-emitting element 100 due to, for example, static electricity, the zener diode generates a bypass current, thereby preventing the light-emitting element 100 from being damaged.

Electrode holes 30a and 30b according to example embodiments of the inventive concepts penetrate the substrate 10 from the first surface of the substrate 10 to the second surface thereof. The electrode holes 30a and 30b are formed on both sides of the light-emitting element 100. Since the electrode holes 30a and 30b penetrate the substrate 10, heat generated by the light-emitting element 100 may be dissipated through the electrode holes 30a and 30b with relative ease.

A width of each of the electrode holes 30a and 30b may be reduced from a surface of the substrate 10 to the center of the substrate 10. That is, the width of each of the electrode holes 30a and 30b may be reduced from the first surface of the substrate 10 to the center of the substrate 10 and then may be increased from the center of the substrate 10 to the second surface of the substrate 10. (See, for example, FIG. 3)

The first and second electrodes 50 and 55 may be connected to each other in the center of each of the electrode holes 30a and 30b.

The first uneven heat dissipation patterns 35 and the second uneven heat dissipation patterns 135 are formed in the second region II of the substrate 10 which surrounds the light-emitting element 100. The first uneven heat dissipation patterns 35 are formed on the first surface of the substrate 10, and the second uneven heat dissipation patterns 135 are formed on the second surface of the substrate 10.

The first and second uneven heat dissipation patterns 35 and 135 may be grooves on the first and second surfaces of the substrate 10, respectively.

The first and second uneven heat dissipation patterns 35 and 135 increase the surface area of the substrate 10, thereby dissipating heat generated by the light-emitting element 100 to the outside. To improve heat dissipation efficiency, the first and second uneven heat dissipation patterns 35 and 135 may have a pyramid shape. However, the shape of the first and second uneven heat dissipation patterns 35 and 135 is not limited to the pyramid shape. That is, the first and second uneven heat dissipation patterns 35 and 135 can have various shapes, such as a cone shape, a cylindrical shape, and a polygonal column shape, as long as they can increase the surface area of the substrate 10.

A passivation film 40 is formed on the first and second surfaces of the substrate 10. The passivation film 40 may be, for example, an oxide film, a nitride film, or an oxynitride film. Specifically, a first passivation film 40a may be formed on the first surface of the substrate 10, and a second passivation film 40b may be formed on the second surface of the substrate 10.

The first passivation film 40a may be formed on the entire first surface of the substrate 10, including the first region I. That is, the first passivation film 40a may also be formed in the first uneven heat dissipation patterns 35 and the electrode holes 30a and 30b which are formed in the first surface of the substrate 10.

The second passivation film 40b may be formed on the entire second surface of the substrate 10, excluding a region in which the zener diode is formed. That is, the second passivation film 40b may also be formed in the second uneven heat dissipation patterns 135 and the electrode holes 30a and 30b which are formed in the second surface of the substrate 10.

The first passivation film 40a and the second passivation film 40b are connected to each other in the electrode holes 30a and 30b.

The first and second electrodes 50 and 55 are formed on the passivation film 40. Specifically, the first electrode 50 including a first upper electrode 50a and a second upper electrode 50b is formed on the first passivation film 40a. The first electrode 50 may be made of a conductive material selected from copper (Cu), aluminum (Al), silver (Ag), aurum (Au), tungsten (W), platinum (Pt), titanium (Ti), zinc (Zn), and nickel (Ni). Alternatively, the first electrode 50 may be made of a combination or stack of the above materials. However, the material of the first electrode 50 is not limited to the above examples.

The first upper electrode 50a and the second upper electrode 50b are separated from each other and are respectively connected to a second conductive pattern 113 and a first conductive pattern 111 of the light-emitting element 100. (See, for Example, FIG. 3)

The first electrode 50 covers the electrode holes 30a and 30b and at least a part of the first uneven heat dissipation patterns 35 which are formed in the first surface of the substrate 10. Specifically, the first electrode 50 may conformally cover surfaces of the first uneven heat dissipation patterns 35. In addition, the first electrode 50 may conformally cover the electrode holes 30a and 30b and may thus be connected to the second electrode 55 in the electrode holes 30a and 30b. Since the first electrode 50 covers the first uneven heat dissipation patterns 35 and the electrode holes 30a and 30b, the heat dissipation efficiency of the light-emitting element 100 may be increased further.

The second electrode 55 including a first lower electrode 55a and a second lower electrode 55b is formed on the second passivation film 40b. The second electrode 55 may be made of the same material as the first electrode 50.

The first lower electrode 55a and the second lower electrode 55b are separated from each other and are respectively connected to the first zener impurity region 20a and the second zener impurity region 20b.

Like the first electrode 50, the second electrode 55 conformally covers the second uneven heat dissipation patterns 135 and the electrode holes 30a and 30b which are formed in the second surface of the substrate 10. Since the first and second electrodes 55 are connected to each other, heat generated by the light-emitting element 100 can be dissipated to the second electrode 55.

The light-emitting element 100 is mounted on the first electrode 50. The light-emitting element 100 may be a light-emitting diode (LED). Although the light-emitting element 100 according to example embodiments of the inventive concepts is not limited to an LED, the following description will be made based on the assumption that the light-emitting element 100 is an LED.

The light-emitting element 100 includes the first conductive pattern 111 of a first conductivity type, a light-emitting pattern 112, and the second conductive pattern 113 of a second conductivity type sequentially stacked on a light-emitting element support substrate 110.

Specifically, the first conductive pattern 111 may be of the first conductivity type (for example, an n type), and the second conductive pattern 113 may be of the second conductivity type (for example, a p type). Conversely, the first conductive pattern 111 may be of the second conductivity type (the p type), and the second conductive pattern 113 may be of the first conductivity type (the n type), depending on a design of the light-emitting element 100.

The light-emitting pattern 112 is a region where light is generated when carriers (for example, electrons) of the first conductive pattern 111 combine with carriers (for example, holes) of the second conductive pattern 113.

Although not shown in the drawings, the light-emitting pattern 112 may include a well layer and a barrier layer. Since the well layer has a smaller band gap than the barrier layer, carriers (electrons and/or holes) gather in the well layer, where they are combined with each other. The light-emitting pattern 112 may have a single quantum well (SQW) structure or a multiple quantum well (MQW) structure, depending on the number of well layers included in the light-emitting layer pattern 121. The SQW structure may include only one well layer while the MQW structure may include a plurality of well layers. In order to control light-emitting properties, at least one of the well layer and the barrier layer may be doped with at least one of boron (B), phosphorous (P), silicon (Si), magnesium (Mg), zinc (Zn), selenium (Se), and aluminum (Al).

The first conductive pattern 111, the second conductive pattern 113, and the light-emitting pattern 112 may be made of $In_xAl_yGa_{(1-x-y)}N$ ($0 \leq x \leq 1$, $0 \leq y \leq 1$).

The light-emitting element 100 may be driven by a driving bias between the first conductive pattern 111 and the second conductive pattern 113. The driving bias is an absolute value of the difference between a first bias applied to the first conductive pattern 111 and a second bias applied to the second conductive pattern 113. The first bias may be delivered to the first conductive pattern 111 via the second upper electrode 50b and a first bump 121, and the second bias may be delivered to the second conductive pattern 113 via the first upper electrode 50a and a second bump 123. The driving bias may be, but is not limited to, direct current (DC) power.

Although not shown in the drawings, a first element electrode (not shown) may be formed on the first conductive pattern 111. The first element electrode may be made of transparent metal or metal having high reflectivity. The first element electrode may be made of at least one of indium tin oxide (ITO), copper (Cu), nickel (Ni), chrome (Cr), aurum (Au), titanium (Ti), platinum (Pt), aluminum (Al), vanadium (V), tungsten (W), molybdenum (Mo), silver (Ag) and a combination thereof.

In addition, a second element electrode (not shown) may be formed on the second conductive pattern 113. The second element electrode may be made of a material having high reflectivity, for example, at least one of silver and aluminum.

Although the light-emitting element 100 shown in the drawing is a flipchip type LED, it is not limited thereto. The light-emitting element 100 may also be, for example, a lateral type LED or a vertical type LED. In a flipchip type LED, a first bump and a second bump face a first surface of a substrate. In a lateral type LED, a first element electrode (not shown) and a second element electrode (not shown) face a top surface (an upper side in FIG. 3) of a light-emitting element. In a vertical type LED, one of a first element electrode (not shown) and a second element electrode (not shown) faces a top surface of a light-emitting element, and the other one faces a bottom surface of the light-emitting element.

Hereinafter, a method of fabricating a light-emitting device according to example embodiments of the inventive concepts will be described with reference to FIGS. 3 and 4 through 7. FIGS. 4 through 7 are cross-sectional views illustrating a method of fabricating a light-emitting device according to example embodiments of the inventive concepts. In the following example embodiments, elements substantially identical to those of the previous example embodiments will be indicated by like reference numerals, and thus their description will be omitted or simplified.

Figure 4:
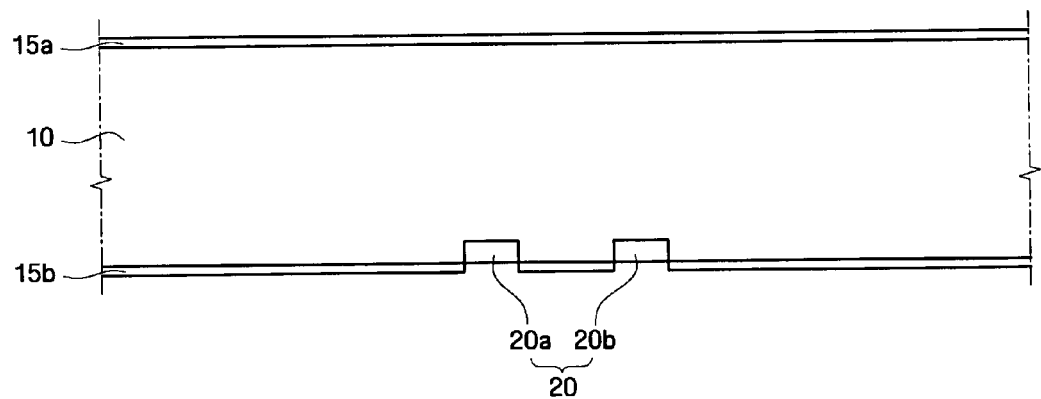
FIGS. 4 through 7 are cross-sectional views illustrating a method of fabricating a light-emitting device according to example embodiments of the inventive concepts.

Referring to FIG. 4, insulating films 15a and 15b are respectively formed on first and second surfaces of a substrate 10. Specifically, an insulating material, for example, an oxide film, a nitride film, or an oxynitride film is formed on each of the first and second surfaces of the substrate 10. Of the insulating material formed on the second surface of the substrate 10, a region in which a zener impurity region 20 is to be formed is removed. As a result, the insulating films 15a and 15b are formed.

Next, impurities of a second conductivity type are doped into the substrate 10, thereby forming the zener impurity region 20. The zener impurity region 20 may be formed by, for example, ion implantation, thermal diffusion, plasma doping, or the like. A pair of zener impurity regions 20a and 20b, which are separated from each other, may be formed by using the insulating film 15b, which is formed on the second surface of the substrate 10, as an etch mask.

Figure 5:
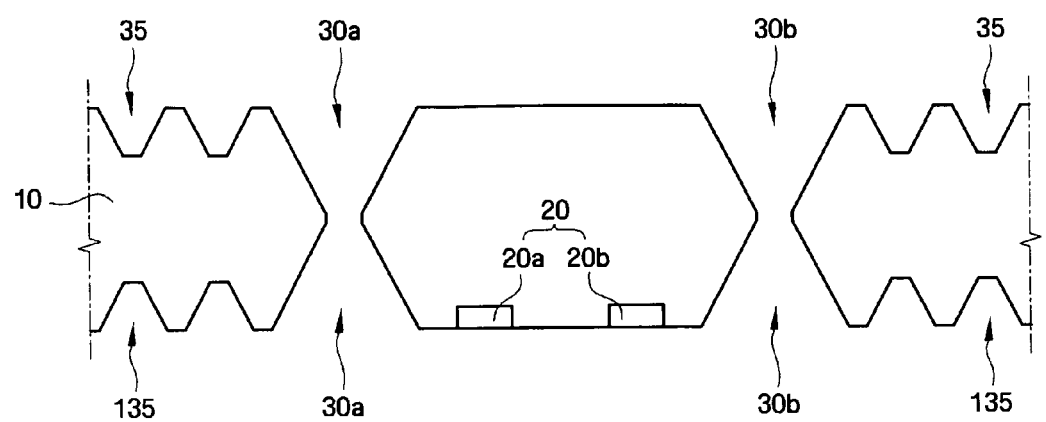

Referring to FIG. 5, the insulating films 15a and 15b are removed.

Then, the first surface of the substrate 10 is etched to form first uneven heat dissipation patterns 35 and grooves for forming electrode holes 30a and 30b.

Here, the substrate 10 may be, for example, wet-etched using an anisotropic wet-etching solution such as a potassium hydroxide (KOH) solution.

Although not shown in the drawing, an insulating film having predetermined portions removed may be formed and then wet-etched, wherein the predetermined portions of the insulating film are regions in which the first uneven heat dissipation patterns 35 and the grooves for forming the electrode holes 30a and 30b are to be formed.

Accordingly, the first uneven heat dissipation patterns 35 are formed in the substrate 10 exposed to the wet-etching solution, as shown in FIG. 5. The first uneven heat dissipation patterns 35 have a pyramid shape. That is, a width of the cross section of each of the first uneven heat dissipation patterns 35 is gradually reduced from the first surface of the substrate 10 to the center of the substrate 10.

The grooves for forming the electrode holes 30a and 30b may be formed at the same time as the first uneven heat dissipation patterns 35. However, when the grooves for forming the electrode holes 30a and 30b are larger than the first uneven heat dissipation patterns 35, a period of time during which the substrate 10 is exposed to the wet-etching solution may be adjusted.

Next, the second surface of the substrate 10 is wet-etched in the same way as the first surface of the substrate 10. As a result, second uneven heat dissipation patterns 135 and grooves for forming the electrode holes 30a and 30b are formed. In this case, the grooves for forming the electrode holes 30a and 30b in the first surface of the substrate 10 are connected to the grooves for forming the electrode holes 30a and 30b in the second surface of the substrate 10, thereby forming the electrode holes 30a and 30b which penetrate the substrate 10. The order in which the first and second surfaces of the substrate 10 are etched may be reversed.

Figure 6:
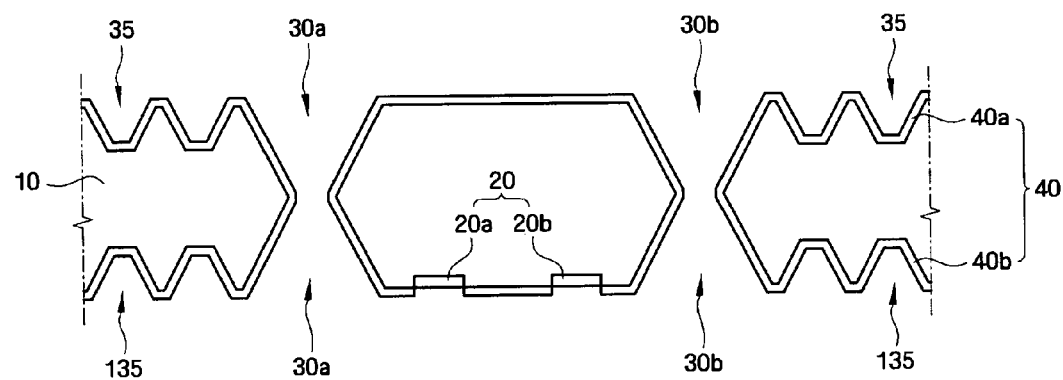

Referring to FIG. 6, a passivation film 40 made of, for example, an oxide film is formed on the exposed surfaces of the substrate 10 by, for example, thermal oxidation.

A first passivation film 40a is formed on the entire first surface of the substrate 10, and a second passivation film 40b is formed on the second surface of the substrate 10, excluding the region in which the zener impurity region 20 is disposed.

Figure 7:
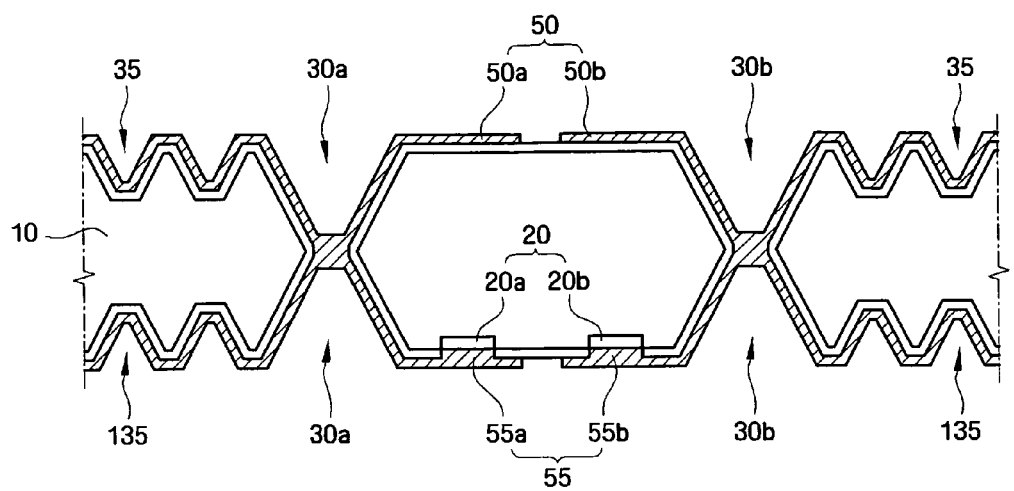

Referring to FIG. 7, a first electrode 50 is formed on the first surface of the substrate 10, and a second electrode 55 is formed on the second surface of the substrate 10. The order in which the first electrode 50 and the second electrode 55 are formed may be reversed.

To form the first electrode 50, a conductive material layer may be formed on the second surface of the substrate 10 by, for example, E-beam evaporation, sputtering, or electroplating.

The conductive material layer may be patterned to form a first upper electrode 50a and a second upper electrode 50b. In this case, the first upper electrode 50a and the second upper electrode 50b are patterned to be separated from each other.

The second electrode 55 and the first electrode 50 may be formed of substantially the same material and by the same process. The second electrode 55 may include a first lower electrode 55a and a second lower electrode 55b. The second electrode 55 formed on the second surface of the substrate 10 may contact the first electrode 50 in the electrode holes 30a and 30b. Specifically, the first lower electrode 55a may directly contact the first upper electrode 50a, and the second lower electrode 55b may directly contact the second upper electrode 50b.

Referring back to FIG. 3, the light-emitting element 100 is formed and mounted on the first electrode 50 using a first bump 121 and a second bump 123.

The light-emitting element 100 includes a first conductive pattern 111 of a first conductivity type, a light-emitting pattern 112, and a second conductive pattern 113 of a second conductivity type are sequentially stacked on a light-emitting element support substrate 110.

Figure 8:
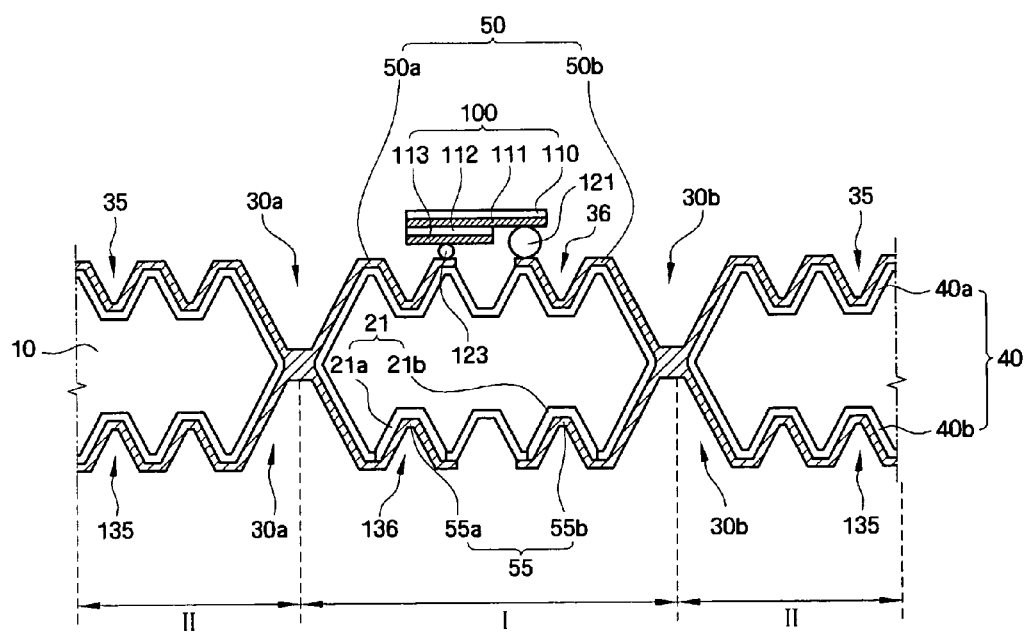
FIG. 8 is a cross-sectional view of a light-emitting device according to example embodiments of the inventive concepts.

Hereinafter, a light-emitting device according to example embodiments of the inventive concepts will be described with reference to FIG. 8. FIG. 8 is a cross-sectional view of a light-emitting device according to example embodiments of the inventive concepts.

Referring to FIG. 8, third uneven heat dissipation patterns 36 and fourth uneven heat dissipation patterns 136 are respectively formed on first and second surfaces of a first region I of a substrate 10. That is, first through fourth heat dissipation patterns 35, 135, 36, and 136 are formed on both the first region I and a second region II of the substrate 10.

A light-emitting element 100 according to example embodiments of the inventive concepts is formed on the first region I. Specifically, the light-emitting element 100 is disposed on the first surface of the substrate 10 and on the third uneven heat dissipation patterns 36 in the first region I.

Accordingly, heat generated by the light-emitting element 100 can be dissipated by most adjacent ones of the third uneven heat dissipation patterns 36, thereby improving heat dissipation efficiency of the light-emitting device.

Zener impurity regions 21a and 21b, according to example embodiments of the inventive concepts, are formed in the fourth uneven heat dissipation patterns 136 which may be formed on the second surface of the substrate 10. The substrate 10 and the zener impurity regions 21a and 21b may form a zener diode. Heat generated by the zener diode and the light-emitting element 100 may be dissipated to the outside by the fourth uneven heat dissipation patterns 136.

A first electrode 50, according to example embodiments of the inventive concepts, conformally may cover electrode holes 30a and 30b, the first uneven heat dissipation patterns 35, and the third uneven heat dissipation patterns 36, thereby improving heat dissipation efficiency.

A second electrode 55, according to example embodiments of the inventive concepts, conformally covers the electrode holes 30a and 30b, the second uneven heat dissipation patterns 135, and the fourth uneven heat dissipation patterns 136, thereby improving heat dissipation efficiency.

Figure 9:
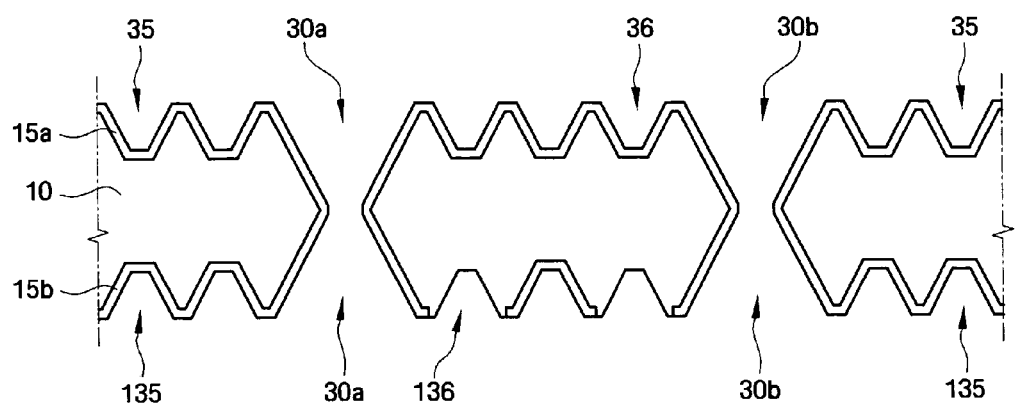
FIGS. 9 through 11 are cross-sectional views illustrating a method of fabricating a light-emitting device according to example embodiments of the inventive concepts.
Figure 10:
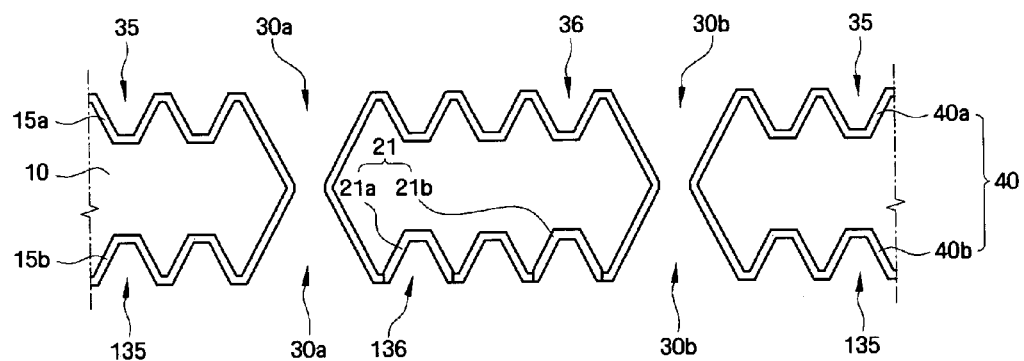
Figure 11:
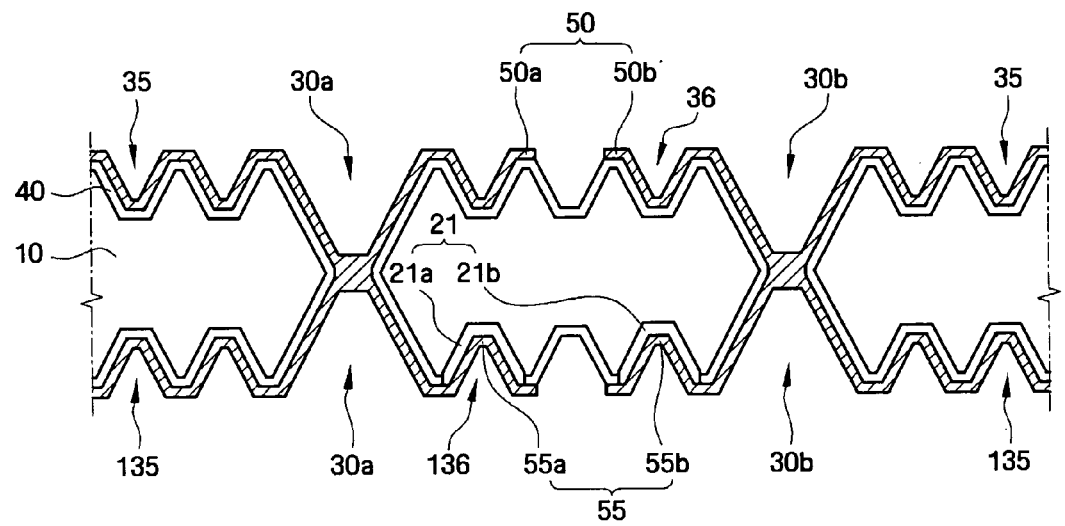

Hereinafter, a method of fabricating a light-emitting device according to example embodiments of the inventive concepts will be described with reference to FIGS. 8 and 9 through 11. FIGS. 9 through 11 are cross-sectional views illustrating a method of fabricating a light-emitting device according to example embodiments of the inventive concepts.

Referring to FIG. 9, a substrate 10 is wet-etched to form third uneven heat dissipation patterns 36 and fourth uneven heat dissipation patterns 136 respectively on a first surface and a second surface of a first region I of the substrate 10. In this case, electrode holes 30a and 30b may also be formed.

Although not shown in the drawing, an insulating film having desired portions removed may be formed, wet-etched, and then removed, wherein the desired portions of the insulating film are regions in which the third uneven heat dissipation patterns 36 and the fourth uneven heat dissipation patterns 136 are to be formed.

Thereafter, insulating films 15a and 15b are formed respectively on the first and second surfaces of the substrate 10. Of the insulating film 15b formed on the second surface of the substrate 10, a region in which a zener impurity region 21 (see FIG. 10) is formed is removed.

Referring to FIG. 10, zener impurity regions 21a and 21b are formed on the second surface of the substrate 10 using the insulating film 15b formed on the second surface of the substrate 10 as an etch mask. Specifically, the zener impurity regions 21a and 21b are formed in the fourth uneven heat dissipation patterns 136.

Thereafter, a passivation film 40 made of an oxide film is formed on the first and second surfaces of the substrate 10. A first passivation film 40a is formed on the entire first surface of the substrate 10, and a second passivation film 40b is formed on the second surface of the substrate 10 excluding regions in which the zener impurity regions 21a and 21b are disposed.

Referring to FIG. 11, a first electrode 50 and a second electrode 55 are formed respectively on the first and second surfaces of the substrate 10.

Referring to FIG. 8, the light-emitting element 100 is mounted on the first electrode 50.

Hereinafter, a light-emitting device according to example embodiments of the inventive concepts will be described with reference to FIG. 12.

Figure 12:
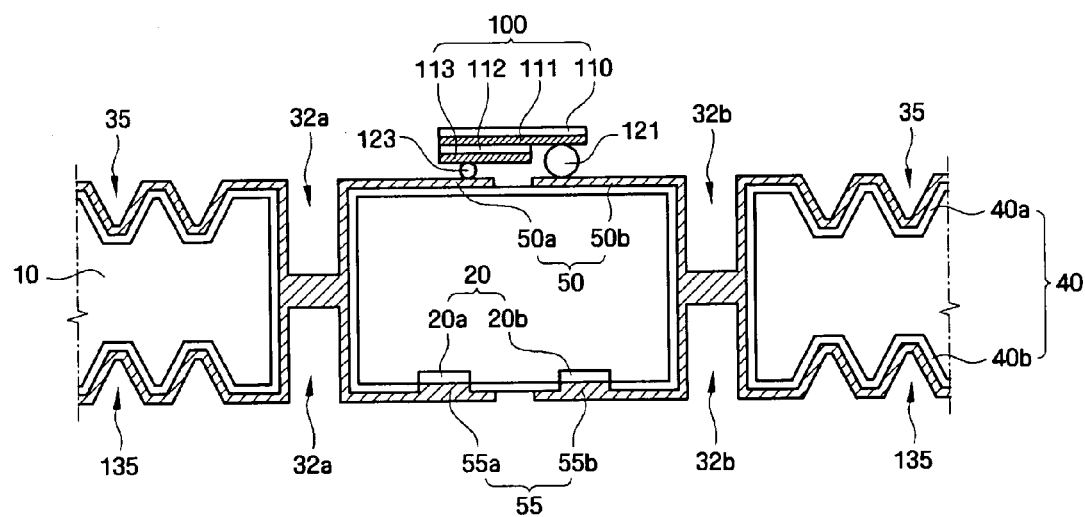
FIG. 12 is a cross-sectional view of a light-emitting device according to example embodiments of the inventive concepts.

Referring to FIG. 12, electrode holes 32a and 32b may be vias, the widths of which remain unchanged from first and second surfaces of a substrate 10 to the center of the substrate 10.

Since methods of fabricating light-emitting devices can be well understood by one of ordinary skill in the art from the fabrication method according to previous example embodiments, a detailed description thereof will be omitted for the sake of brevity. Meanwhile, the electrode holes 32a and 32b, according to example embodiments, may be formed by a dry-etching process and may be formed in a fabrication step separate from the fabrication of uneven heat dissipation patterns 35 and 135.

Figure 13:
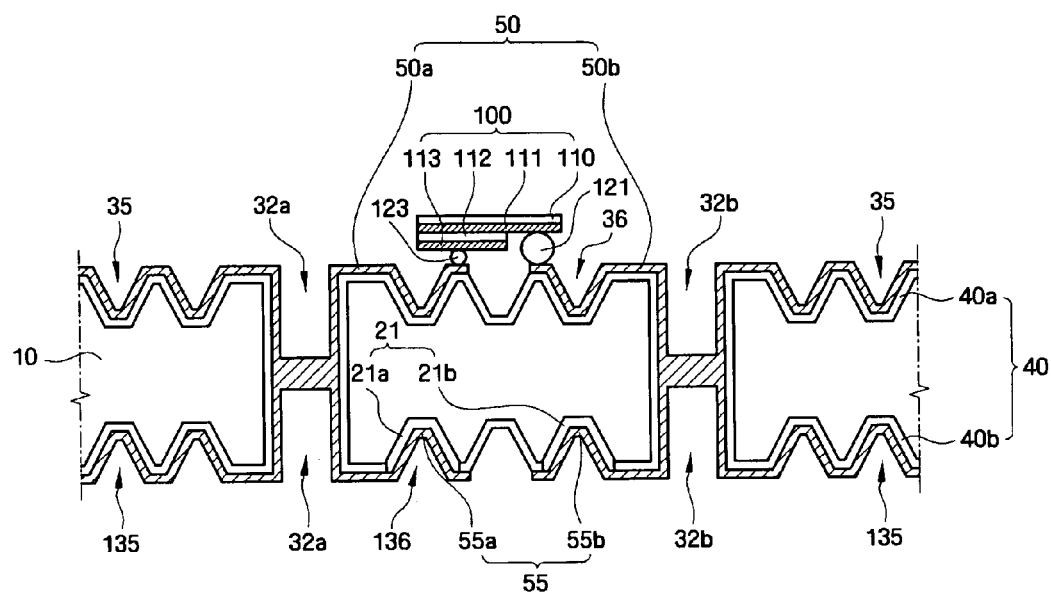
FIG. 13 is a cross-sectional view of a light-emitting device according to example embodiments of the inventive concepts.

Hereinafter, a light-emitting device according to example embodiments of the inventive concepts will be described with reference to FIG. 13. FIG. 13 is a cross-sectional view of a light-emitting device according to example embodiments of the inventive concepts.

The light-emitting device according to example embodiments is somewhat similar to the light-emitting device according to example embodiments of the inventive concepts, except that electrode holes 32 and 32b are vias, the widths of which remains unchanged from first and second surfaces of a substrate 10 to the center of the substrate 10.

In example embodiments, heat dissipation efficiency of the light-emitting device may be improved by third uneven heat dissipation patterns 36 and fourth uneven heat dissipation patterns 136.

Figure 14:
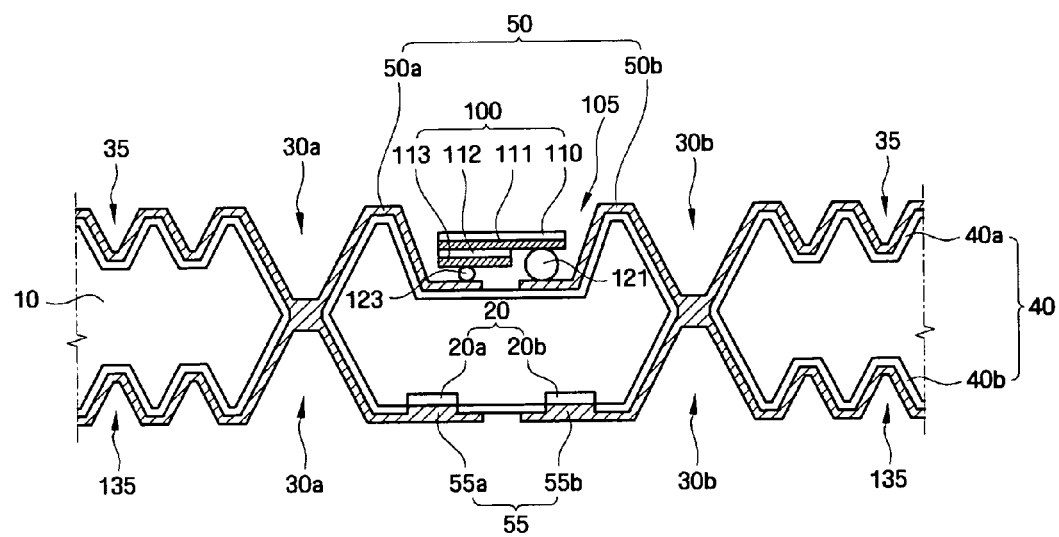
FIG. 14 is a cross-sectional view of a light-emitting device according to example embodiments of the inventive concepts.

Hereinafter, a light-emitting device according to example embodiments of the inventive concepts will be described with reference to FIG. 14. FIG. 14 is a cross-sectional view of a light-emitting device according to example embodiments of the inventive concepts.

Referring to FIG. 14, a light-emitting element mounting groove 105 is formed on a substrate 10 and that a light-emitting element 100 is mounted in the light-emitting element mounting groove 105. The light-emitting element mounting groove 105 may be filled with transparent resin (not shown).

The light-emitting element mounting groove 105 is larger than the light-emitting element 100. The size of the light-emitting element mounting groove 105 may be determined by a degree by which light emitted from the light-emitting element 100 is reflected by sidewalls of the light-emitting element mounting groove 105, an angle at which the light is reflected by the sidewalls of the light-emitting element mounting groove 105, the type of transparent resin that fills the light-emitting element mounting groove 105, or the like. It is desirable to place the light-emitting element 100 in the center of the light-emitting element mounting groove 105. If the light-emitting device 100 and the sidewalls of the light-emitting element mounting groove 105 are separated by equal distances from each other, chromatic nonuniformity may be prevented.

Figure 15:
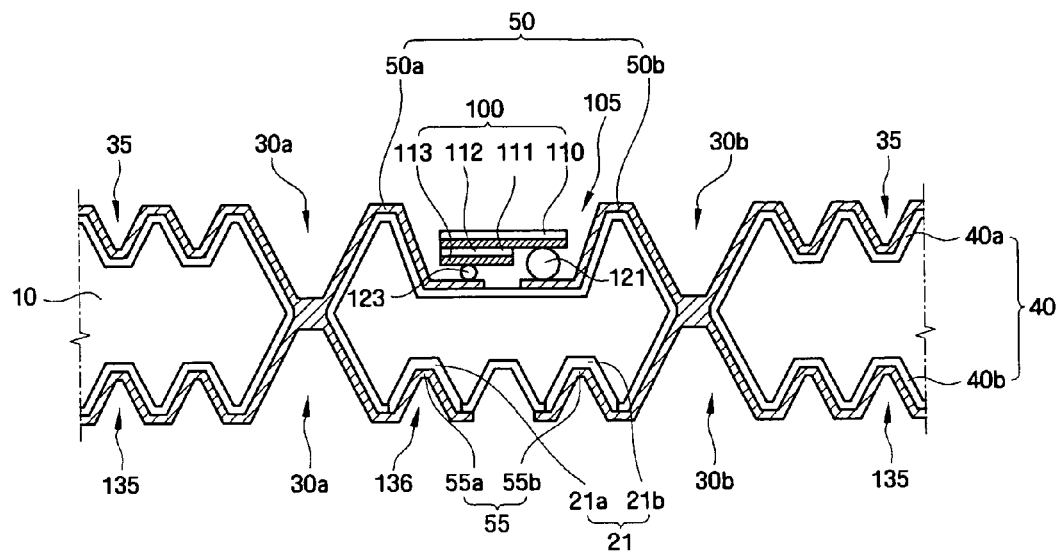
FIG. 15 is a cross-sectional view of a light-emitting device according to example embodiments of the inventive concepts.

Hereinafter, a light-emitting device according to example embodiments of the inventive concepts will be described with reference to FIG. 15. FIG. 15 is a cross-sectional view of a light-emitting device according to example embodiments of the inventive concepts.

Referring to FIG. 15, a light-emitting element mounting groove 105 is formed on a substrate 10 and that a light-emitting element 100 is mounted in the light-emitting element mounting groove 105.

Figure 16:
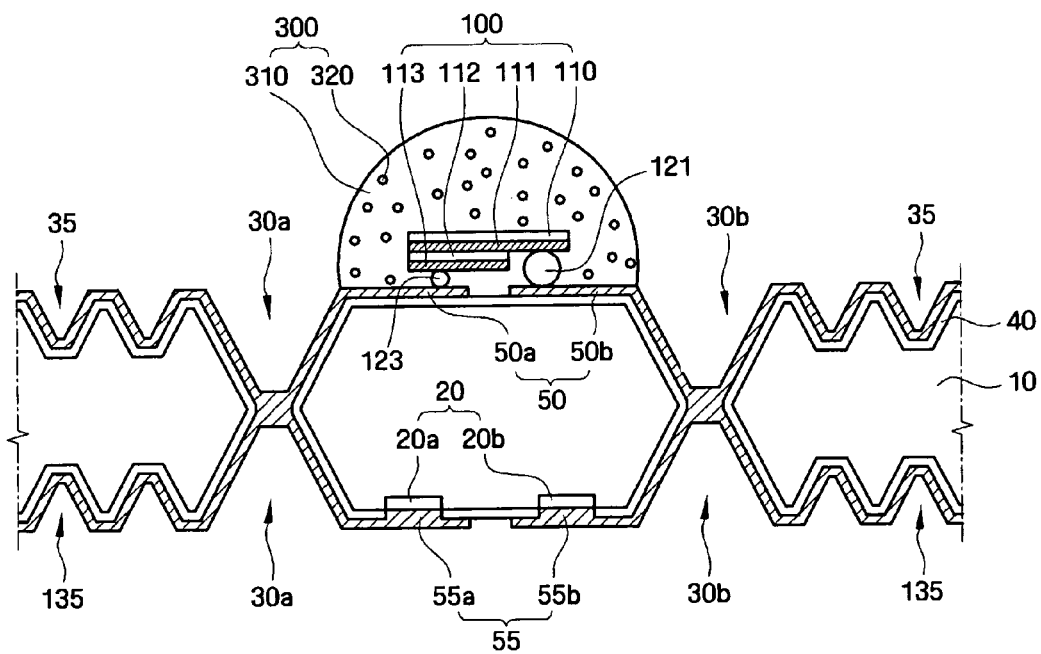
FIG. 16 is a cross-sectional view of a light-emitting device according to example embodiments of the inventive concepts.

Hereinafter, a light-emitting device according to example embodiments of the inventive concepts will be described with reference to FIG. 16. FIG. 16 is a cross-sectional view of a light-emitting device according to example embodiments of the inventive concepts.

In the light-emitting device according to example embodiments, a phosphor layer 300 is formed on the light-emitting device 1 according to above example embodiments.

Referring to FIG. 16, the light-emitting device according to example embodiments the phosphor layer 300 includes transparent resin 310 which surrounds a light-emitting element 100 and phosphors 320 dispersed in the transparent resin 310.

The phosphor layer 300 may be a mixture of the transparent resin 310 and the phosphors 320. The phosphors 320 dispersed in the phosphor layer 300 absorb light emitted from the light-emitting element 100 and convert the wavelength of the light. As such, an even distribution of the phosphors 320 may result in better light-emitting properties, thereby improving wavelength conversion and color mixture by the phosphors 320.

The phosphor layer 300 may be formed such that the light-emitting device according to example embodiments produces white light. If the light-emitting element 100 emits light having a blue wavelength, the phosphors 320 may include yellow phosphors. The phosphors 320 may also include red phosphors in order to increase a color-rendering index (CRI). If the light-emitting element 100 emits light having a UV wavelength, the phosphors 320 may include red, green and blue phosphors.

The transparent resin 310 may be any material that may disperse the phosphors 320 in a stable manner. For example, the transparent resin 310 may be epoxy resin, silicon resin, hard silicon resin, denatured silicon resin, urethane resin, oxetane resin, acrylic resin, polycarbonate resin, or polyimide resin.

The phosphors 320 may be any material that can absorb light from the light-emitting element 100 and convert the wavelength of the absorbed light. For example, the phosphors 320 may be at least one of a nitride-based or an oxynitride-based phosphors activated by a lanthanoid element such as europium (Eu) or cerium (Ce); an alkaline earth halogen apatite phosphors activated by a lanthanoid element such as Eu or a transition metal element such as manganese (Mn); an alkaline earth metal halogen borate phosphors; an alkaline earth metal aluminate phosphors; an alkaline earth silicate phosphors; an alkaline earth sulfide phosphors; an alkaline earth thiogallate phosphors; an alkaline earth silicon nitride phosphors; a germanate phosphors; a rare earth aluminate phosphors activated by a lanthanoid element such as Ce; a rare earth silicate phosphors; and an organic or an organic complex phosphors activated by a lanthanoid element such as Eu, for example. Specifically, phosphors listed below may be used. However, the phosphors 320 are not limited to the following examples.

Examples of nitride-based phosphors activated by a lanthanoid element such as Eu or Ce may include $M_2Si_5N_8$:Eu (M is at least one of Sr, Ca, Ba, Mg and Zn), $MSi_7N_{10}$:Eu, $M_{1.8}Si_5O_{0.2}N_8$:Eu, and $M_{0.9}Si_7O_{0.1}N_{10}$:Eu (M is at least one of Sr, Ca, Ba, Mg and Zn).

Examples of oxynitride-based phosphors activated by a lanthanoid element such as Eu or Ce may include $MSi_2O_2N_2$:Eu (M is at least one of Sr, Ca, Ba, Mg and Zn).

Examples of alkaline earth halogen apatite phosphors activated by a lanthanoid element such as Eu or a transition metal element such as Mn may include $M_5(PO_4)_3X$:R (M is at least one of Sr, Ca, Ba, Mg and Zn, X is at least one of F, Cl, Br and I, and R is at least one of Eu and Mn).

Examples of alkaline earth metal halogen borate phosphors may include $M_2B_5O_9X$:R (M is at least one of Sr, Ca, Ba, Mg and Zn, X is at least one of F, Cl, Br and I, and R is at least one of Eu and Mn).

Examples of alkaline earth metal aluminate phosphors may include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one of Eu and Mn).

Examples of alkaline earth sulfide phosphors may include $La_2O_2S$:Eu, $Y_2O_2S$:Eu, and $Gd_2O_2S$:Eu.

Examples of rare earth aluminate phosphors activated by a lanthanoid element such as Ce may include YAG phosphors represented by compositional formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$. Other examples may include phosphors such as $Tb_3Al_5O_{12}$:Ce and $Lu_3Al_5O_{12}$:Ce in which part or all of Y is replaced by Tb, Lu, or the like.

Rare earth silicate phosphors may contain silicate, and examples of the rare earth silicate phosphors may include $(SrBa)_2SiO_4$:Eu.

Examples of other phosphors may include ZnS:Eu, $Zn_2GeO_4$:Mn, and $MGa_2S_4$:Eu (M is at least one of Sr, Ca, Ba, Mg and Zn, and X is at least one of F, Cl, Br, and I).

The above phosphors may also include at least one of Tb, Cu, Ag, Au, Cr, Nd, Dy, Co, Ni and Ti, instead of or in addition to Eu. Furthermore, other phosphors that offer similar performance and effects to the phosphors listed above can also be used.

Figure 17:
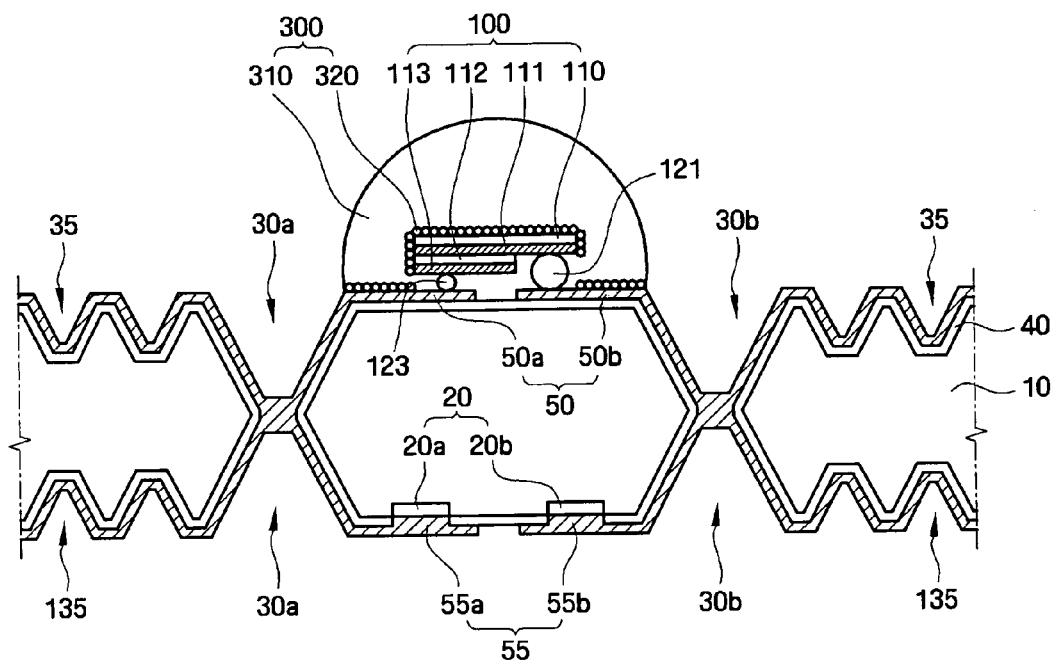
FIG. 17 is a cross-sectional view of a light-emitting device according to example embodiments of the inventive concepts.

Hereinafter, a light-emitting device according to example embodiments of the inventive concepts will be described with reference to FIG. 17. FIG. 17 is a cross-sectional view of a light-emitting device according to example embodiments of the inventive concepts.

Referring to FIG. 17, phosphors 320 are coated on a portion of the first electrode 50 and a light-emitting element 100. In this case, the phosphors 320 may be dissolved in a volatile material, such as acetone, and may be coated accordingly. Then, the acetone may be heated so that it vaporizes and is thus removed. Accordingly, the phosphors 320 cover a top surface of the portion of the first electrode 50 and top and side surfaces of the light-emitting element 100. Consequently, light emitted from the light-emitting element 100 may be dissipated to the atmosphere via the phosphors 320.

Hereinafter, light-emitting systems according to example embodiments of the inventive concepts will be described with reference to FIGS. 18 through 22. FIGS. 18 through 22 are schematic diagrams showing light-emitting systems according to example embodiments of the inventive concepts.

Figure 18:
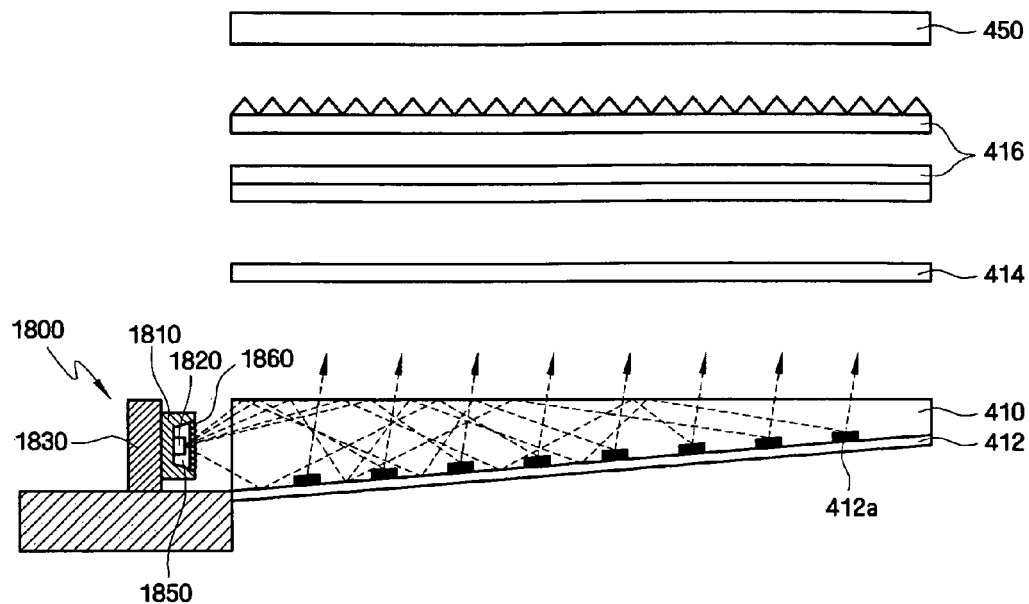
FIGS. 18 through 22 illustrate light-emitting systems according to example embodiments of the inventive concepts.

The light-emitting system shown in FIG. 18 is a product that may include a light-emitting device 1800 according to above disclosed example embodiments of the inventive concepts. The light-emitting system of FIG. 18 may be used in various apparatuses such as lighting apparatuses, display apparatuses, and mobile apparatuses (mobile phones, MP3 players, navigations, etc.). The light-emitting system shown in FIG. 18 is an edge-type backlight unit (BLU) used in a liquid crystal display (LCD). Since LCDs do not include a light source, they use a BLU as their light source. Generally, a BLU is disposed behind a liquid crystal panel and provides light to the liquid crystal panel.

Referring to FIG. 18, the light-emitting system, (BLU) may include a light-emitting device 1800, a light guide plate 410, a reflective plate 412, a diffusion sheet 414, and a pair of prism sheets 416.

The light-emitting device 1800 may provide light and may be of a side-view type. The color temperature of white light emitted from the light-emitting device 1800 may be adjusted by controlling the level of driving power. By adjusting the color temperature of white light emitted from the light-emitting device 1800 of the BLU a user desired image may be displayed on a liquid crystal panel 450.

The light guide plate 410 may guide light to the liquid crystal panel 450. The light guide plate 410 may be a panel made of a transparent plastic material such as acryl, for example, and may guide light emitted from the light-emitting device 1800 to the liquid crystal panel 450 which is disposed above the light guide plate 410. Thus, various patterns 412a are printed on a lower surface of the light guide plate 410 and guide light input to the light guide plate 410 to the liquid crystal panel 450.

The reflective plate 412 is disposed on a lower surface of the light guide plate 410 and reflects light which is transmitted thereon from the light guide plate 410. That is, the reflective plate 412 reflects light, which is not reflected by the various patterns 412a printed on the lower surface of the light guide plate 410, to an output surface of the light guide plate 410. In this manner, the reflective plate 412 may reduce loss of light and may improve the uniformity of light which is output from the output surface of the light guide plate 410.

The diffusion sheet 414 may diffuse light emitted from the light guide plate 410, thereby preventing the light from being concentrated in a specific area.

Each of the prism sheets 416 has a desired array of triangular prisms on an upper surface thereof. The prism sheets 416 typically include two sheets, and an array of triangular prisms formed on one of the two prism sheets 416 cross an array of triangular prisms formed on the other one of the two prism sheets 416 at a desired angle, so that light diffused by the diffusion sheet 414 can proceed in a direction perpendicular to the liquid crystal panel 450.

Figure 19:
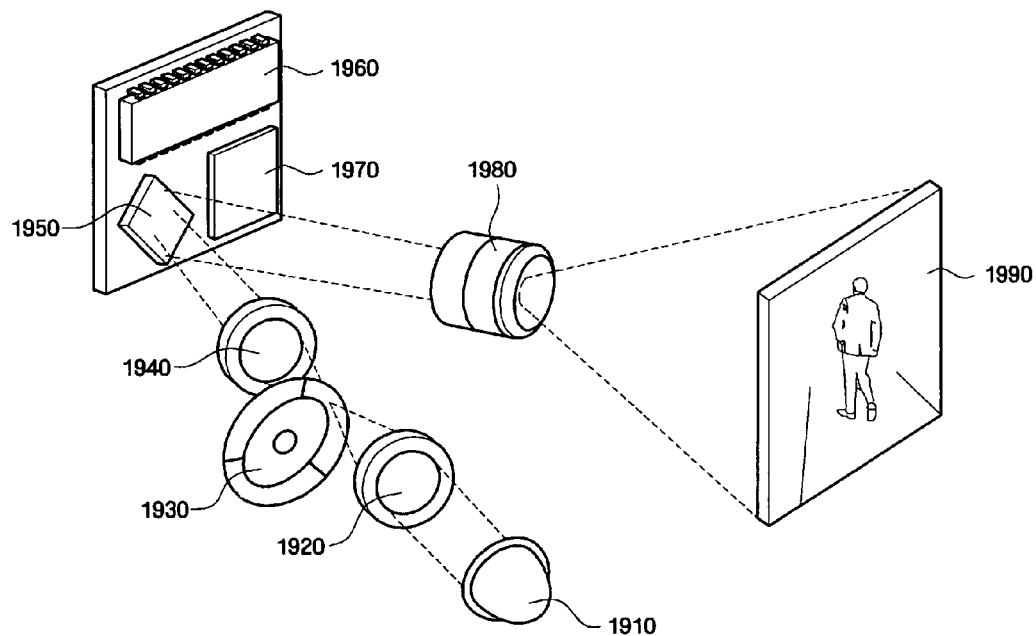
Figure 20:
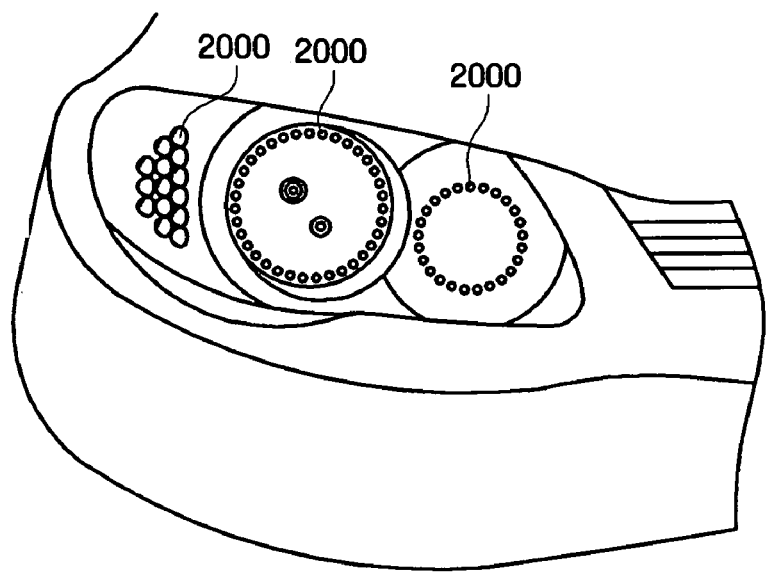
Figure 21:
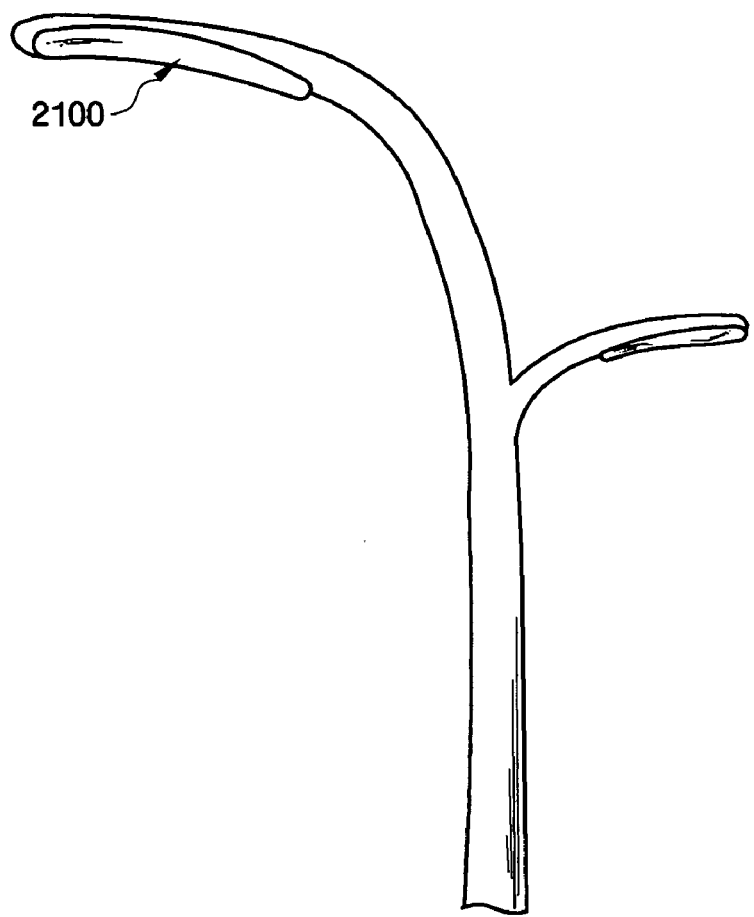
Figure 22:
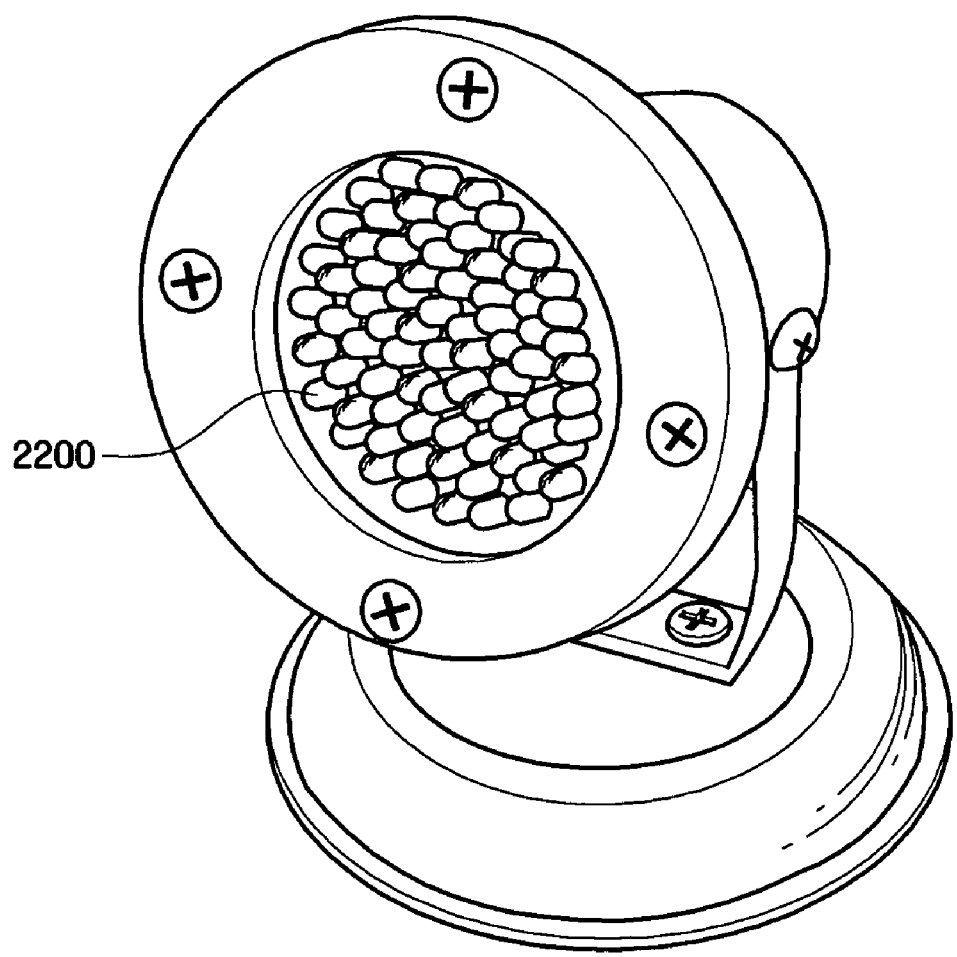

FIG. 19 shows a projector, FIG. 20 shows a headlight of a vehicle, FIG. 21 shows a streetlight, and FIG. 22 shows a lamp. Light-emitting devices used in FIGS. 19 through 22 may be of a top-view type.

Referring to FIG. 19, light emitted from a light source 1910 passes through a condensing lens 1920, a color filter 1930, and a sharping lens 1940. Then, the light is reflected by a digital micromirror device 1950 and passes through a projection lens 1980 to reach a screen 1990. A light-emitting device according to aforementioned example embodiments of the inventive concepts may be included in the light source 1910.

The headlight of the vehicle shown in FIG. 20, the streetlight shown in FIG. 21 and the lamp shown in FIG. 22 may have user desired characteristics by adjusting the color temperature of white light emitted from respective light-emitting devices 2000, 2100 and 2200. Here, the color temperature of the white light may be adjusted by changing driving power supplied to both surfaces of a light-emitting element using variable resistance. The light-emitting devices 2000, 2100 and 2200 may be embodied as the light-emitting devices according to aforementioned example embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A light-emitting device comprising:
    a substrate;
    at least one uneven heat dissipation pattern on at least one of a first and second surfaces of the substrate;
    a light-emitting element on the first surface of the substrate;
    an electrode connected to the light-emitting element and covering at least a portion of the at least one uneven heat dissipation pattern and an electrode hole;
    the electrode hole penetrating the substrate;
    wherein the electrode includes a first electrode on the first surface of the substrate and a second electrode on the second surface of the substrate, and
    the first electrode and the second electrode are connected to each other in the electrode hole.

2. The light-emitting device of claim 1, wherein the at least one uneven heat dissipation pattern is in a first region of the substrate, the first region including the light-emitting element, and a second region of the substrate surrounding the light-emitting element.

3. The light-emitting device of claim 2, wherein the at least one uneven heat dissipation pattern includes grooves in the at least one of the first and second surfaces in the first and second region of the substrate.

4. The light-emitting device of claim 2, wherein the at least one uneven heat dissipation pattern includes grooves in the at least one of the first and second surfaces in the second region of the substrate.

5. The light-emitting device of claim 3, wherein the grooves of the at least one uneven heat dissipation pattern have a pyramid shape.

6. The light-emitting device of claim 1, wherein the substrate is a silicon substrate doped with impurities of a first conductivity type.

7. The light-emitting device of claim 6, further comprising at least one zener impurity region containing impurities of a second conductivity opposite to the first conductivity type, wherein
the at least one zener impurity region is in the second surface of the substrate, and
the substrate and the zener impurity region include a zener diode.

8. The light-emitting device of claim 7, wherein the at least one zener impurity region is in at least a portion of the at least one uneven heat dissipation pattern.

9. The light-emitting device of claim 2, comprising a mounting groove in the first region of the substrate, the light-emitting element is in the mounting groove.

10. The light-emitting device of claim 2, further comprising a phosphor layer on the light-emitting element, the phosphor layer including a resin and phosphors.

11. The light-emitting device of claim 10, wherein the phosphors are dispersed in the resin or are coated on at least a portion of the light-emitting element and the electrode.

12. The light-emitting device of claim 10, wherein the resin is a transparent resin and is at least one of an epoxy resin, a silicon resin, a hard silicon resin, a denatured silicon resin, a urethane resin, an oxetane resin, an acrylic resin, a polycarbonate resin, and polyimide resin.

13. The light-emitting device of claim 10, wherein the phosphors are at least one of a nitride-based phosphors, oxynitride-based phosphors, alkaline earth halogen apatite phosphors, alkaline earth metal halogen borate phosphors, alkaline earth metal aluminate phosphors, alkaline earth silicate phosphors, alkaline earth sulfide phosphors, alkaline earth thiogallate phosphors, alkaline earth silicon nitride phosphors, germanate phosphors, rare earth aluminate phosphors, rare earth silicate phosphors, organic phosphors and organic complex phosphors.

14. The light-emitting device of claim 1, wherein the light-emitting element includes a first conductive pattern of a first conductivity type, a light-emitting pattern and a second conductive pattern of a second conductivity type stacked on a support substrate and wherein the light-emitting element is connected to the electrode via bumps.

* * * * *